United States Patent
Zhang et al.

(10) Patent No.: US 11,587,727 B2
(45) Date of Patent: Feb. 21, 2023

(54) SYSTEMS AND METHODS FOR MONITORING COMPONENTS IN A POWER TRANSFORMER OR THE LIKE

(71) Applicant: HITACHI ENERGY SWITZERLAND AG, Baden (CH)

(72) Inventors: George Zhang, Windsor, CT (US); James Stoupis, Raleigh, NC (US); Gregory F. Rossano, Enfield, CT (US); Xiaoming Feng, Cary, NC (US); Luiz A.V. Cheim, St. Charles, MO (US); Craig Stiegemeier, St. Charles, MO (US)

(73) Assignee: HITACHI ENERGY SWITZERLAND AG, Baden (CH)

( * ) Notice: Subject to any disclaimer, the term of this patent is extended or adjusted under 35 U.S.C. 154(b) by 354 days.

(21) Appl. No.: 16/459,035

(22) Filed: Jul. 1, 2019

(65) Prior Publication Data
US 2020/0098513 A1 Mar. 26, 2020

Related U.S. Application Data

(63) Continuation of application No. PCT/US2018/012083, filed on Jan. 2, 2018.
(Continued)

(51) Int. Cl.
*H01F 27/40* (2006.01)
*G01R 31/12* (2020.01)
(Continued)

(52) U.S. Cl.
CPC ....... *H01F 27/402* (2013.01); *G01R 31/1218* (2013.01); *H01F 27/02* (2013.01);
(Continued)

(58) Field of Classification Search
CPC ........ H01F 27/402; H01F 27/02; H01F 30/06; H01F 2027/404; H01F 2027/406; G01R 31/1218
(Continued)

(56) References Cited

U.S. PATENT DOCUMENTS 5,534,853 A * 7/1996 Pioch ................. H02H 3/00
324/624
6,494,617 B1 * 12/2002 Stokes .............. G01N 33/2888
374/142

(Continued)

FOREIGN PATENT DOCUMENTS

CN 101236227 A 8/2008
CN 101248500 A 8/2008
(Continued)

OTHER PUBLICATIONS

Extended European Search Report dated Jun. 12, 2020 for European Patent Application No. 18734013.8, 16 pages.
(Continued)

*Primary Examiner* — Yemane Mehari
(74) *Attorney, Agent, or Firm* — Sage Patent Group

(57) ABSTRACT

The present application is directed to an electrical system including a housing configured to hold electrical components within an internal volume. In one aspect the electrical system is a power transformer. A sensor is mounted to the housing and is configured to sense a parameter associated with one or more electrical components during operation of the electrical system. A control system including a communication unit and a data processing unit is operable for analyzing the sensed parameter and comparing the sensed parameter to a predetermined minimum or maximum threshold value.

17 Claims, 6 Drawing Sheets

Related U.S. Application Data

(60) Provisional application No. 62/441,223, filed on Dec. 31, 2016.

(51) Int. Cl.
*H01F 27/02* (2006.01)
*H01F 30/06* (2006.01)

(52) U.S. Cl.
CPC ....... *H01F 30/06* (2013.01); *H01F 2027/404* (2013.01); *H01F 2027/406* (2013.01)

(58) Field of Classification Search
USPC .......................................................... 361/35
See application file for complete search history.

(56) References Cited

U.S. PATENT DOCUMENTS

| | | | | |
|---|---|---|---|---|
| 2016/0118186 A1* | 4/2016 | Frimpong | ................ | F41J 5/056 307/119 |
| 2017/0168034 A1* | 6/2017 | Fenton | .................. | G01K 13/02 |
| 2017/0274419 A1* | 9/2017 | Frimpong | ................ | C09D 7/61 |
| 2017/0336243 A1* | 11/2017 | Saveliev | ............. | G01F 23/2965 |

FOREIGN PATENT DOCUMENTS

| | | |
|---|---|---|
| CN | 102133702 A | 7/2011 |
| CN | 202093128 U | 12/2011 |
| CN | 202501904 U | 10/2012 |
| CN | 102891042 | 1/2013 |
| CN | 202796315 U | 3/2013 |
| CN | 203311973 U | 11/2013 |
| CN | 103559980 A | 2/2014 |
| CN | 103562686 A | 2/2014 |
| CN | 204464955 U | 7/2015 |
| CN | 104914066 A | 9/2015 |
| CN | 105026112 | 11/2015 |
| CN | 105759153 | 7/2016 |
| CN | 205542285 U | 8/2016 |
| CN | 106130055 | 11/2016 |
| DE | 102014113470 A1 | 3/2016 |
| EP | 0875972 A1 | 3/1998 |
| EP | 1085534 A2 | 3/2001 |
| EP | 2858077 A1 | 4/2015 |
| EP | 2858077 A1 * | 4/2015 ........... G01L 19/147 |
| IN | 20110014212 | 8/2012 |
| JP | 5344223 B | 11/1974 |
| JP | S50-027588 B | 9/1975 |
| JP | 5484227 A | 7/1979 |
| JP | 63118548 U | 8/1988 |
| JP | 63289802 A | 11/1988 |
| JP | 01248925 A | 10/1989 |
| JP | H0327506 A | 2/1991 |
| JP | 0455582 U | 5/1992 |
| JP | 6-504651 | 5/1994 |
| JP | 8-136597 | 5/1996 |
| JP | 8-223718 | 8/1996 |
| JP | 2005308417 A | 11/2005 |
| JP | 2012151288 A | 8/2012 |
| JP | 2016226265 A | 12/2016 |
| KR | 101055329 B1 | 8/2011 |
| RU | 106368 U1 | 7/2011 |

OTHER PUBLICATIONS

First Office Action, Chinese Patent Application No. 2018800151154 dated Nov. 24, 2020, 10 pages.
First Office Action, Japanese Patent Application No. 2019-535770 dated Aug. 5, 2020, 16 pages.
International Bureau of WIPO, International Preliminary Report on Patentability issued in corresponding Application No. PCT/US2018/012083, dated Jul. 11, 2019, 9 pp.
International Searching Authority / US, International Search Report & Written Opinion issued in corresponding Application No. PCT/US2018/012083, dated Mar. 15, 2018, 15 pp.
Notice of Reasons for Refusal, Japanese Patent Application No. 2019-535770, dated Jan. 6, 2022, 24 pages.
Third Office Action, Chinese Patent Application No. 2018800151154, dated Jan. 5, 2022, 5 pages.
Communication Under Article 94(3) EPC, dated Nov. 23, 2022, 10 pages.
Anonymous: "Fisheye Lens—Wikipedia," Dec. 26, 2018, (XP055978152) retrieved from the internet: URL: https://en.wikipedia.org/w/index.php?title=Fisheye_lens&oldid=875480954 12 pages.

* cited by examiner

SYSTEMS AND METHODS FOR MONITORING COMPONENTS IN A POWER TRANSFORMER OR THE LIKE

TECHNICAL FIELD

The present application is generally directed to an electrical housing such as a transformer and more particularly, but not exclusively to a system for monitoring and controlling components within an internal volume of the electrical housing during operation.

BACKGROUND

Electrical housings for electrical power generation, power control, power transmission and power transformers or the like are difficult to repair, transport and/or replace. Prior art systems have certain deficiencies with respect to monitoring of internal mechanical and electrical components such as windings, cables, supports and connectors during operation. Typically, the electrical housing must be taken offline and de-energized when inspection and/or maintenance is required. This requires draining insulating fluids for certain electrical housings, such as those of power transformers before an inspector is able to enter into the housing to inspect or repair the internal components. Some existing systems have various shortcomings, drawbacks, and disadvantages relative to certain applications. Accordingly, there remains a need for further contributions in this area of technology.

SUMMARY

One embodiment of the present application includes a transformer with means for monitoring internal components during operation. Other embodiments include apparatuses, systems, devices, hardware, methods, and combinations for methods for real time monitoring and controlling internal components within electrical apparatus of a power distribution and transmission system. Further embodiments, forms, features, aspects, benefits, and advantages of the present application shall become apparent from the description and figures provided herewith.

BRIEF DESCRIPTION OF THE FIGURES

In the accompanying drawings, structural embodiments are illustrated that, together with the detailed description provided below, describe exemplary embodiments of a transformer having ports for inspecting components inside an internal volume of the transformer. Further, in the accompanying drawings and description that follow, like parts are indicated throughout the drawings and written description with the same reference numerals, respectively. The figures are not drawn to scale unless provided to the contrary and the proportions of certain parts have been exaggerated for convenience of illustration.

DETAILED DESCRIPTION OF THE ILLUSTRATIVE EMBODIMENTS

Figure 1:
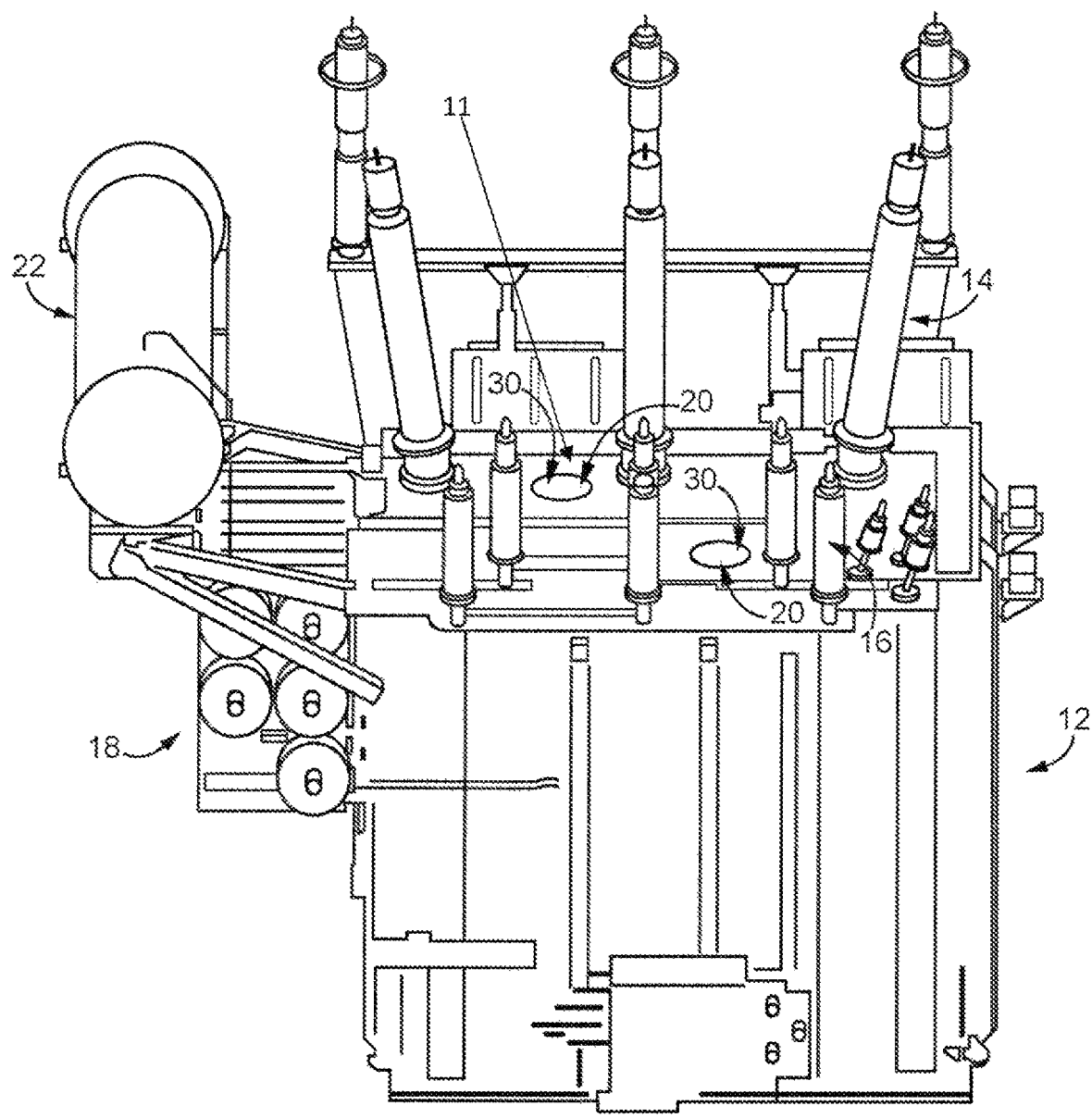
FIG. 1 is a perspective view of one exemplary embodiment of a power transformer.

With reference to FIG. 1, an exemplary electrical housing in the form of a power transformer 10 is depicted. It should be understood that other types of electrical apparatus may be used with embodiments of the present application. The transformer 10 includes a tank 12 defined by a top wall 11, side walls 13 and a bottom wall 15 that bounds an internal volume. The tank 12 may contain an insulating medium 32 such as a dielectric fluid, a core, and at least one coil assembly formed of high and low voltage coil windings mounted to the core. The transformer 10 can include a port 20 formed in at least one of the top wall 11, side walls 13 and bottom wall 15. Each of the ports 20 can include a removable cover 30 coupled thereto. The cover 30 can be configured to provide visual and or sensor access to components located in the internal volume during operation wherein at least one coil is energized and a converted electrical output is produced. The present application contemplates one or more ports 20 of similar or different configurations.

The ports 20 can be configured to provide ingress and egress access for inspectors or maintenance workers to/from the internal volume of the transformer 10 when the transformer 10 is de-energized and any insulating medium 32 has been drained or purged. The ports 20 are further configured to provide inspection access to internal transformer components and corresponding cover 30 during operation of the transformer 10. Each port 20 is provided with a cover 30 suitable to facilitate sensor access to the internal volume. In some forms the cover may be transparent or translucent to be compatible with an optical sensor such as a camera. In other forms the cover 30 can include materials compatible with other types of sensors. For example, a thermal or infrared sensor, may require material that permits a certain desired wavelength or frequency range to pass therethrough. In yet other forms, an acoustic sensor may require covers having a specified material stiffness or other desired material properties. In some forms an infrared sensor may be positioned adjacent to and/or coupled to a cover 30 formed at least partially of a glass-fiber reinforced polymer and a camera may be positioned adjacent to and/or coupled to a cover 30 made at least partially from an amorphous solid such as glass or the like.

It should be understood that the methods and systems described herein are not limited to a power transformer, but on the contrary may be used with any electrical apparatus that may or may not be fluid filled during operation. The exemplary transformer 10 can a power transformer, a shunt reactor, or substation distribution transformer and may be single-phase or poly-phase, e.g. three-phase, depending upon the application. The transformer 10 provides converted electrical power at an output of the transformer 10 to the power grid or load. The transformer 10 can be a step-up or step-down transformer 10 and the corresponding voltages and currents are increased or decreased depending upon the application. In some embodiments, the transformer 10 can include a conservator 22 for retaining dielectric fluid provided to the internal volume, radiators 18 for cooling the transformer 10 during operation, and high- and low-voltage bushings 14, 16. It should be understood that in other embodiments, the transformer 10 may not include a conservator 22 or a gas space between the top level of an insulating medium 32 and a top wall of the tank 12.

Figure 2:
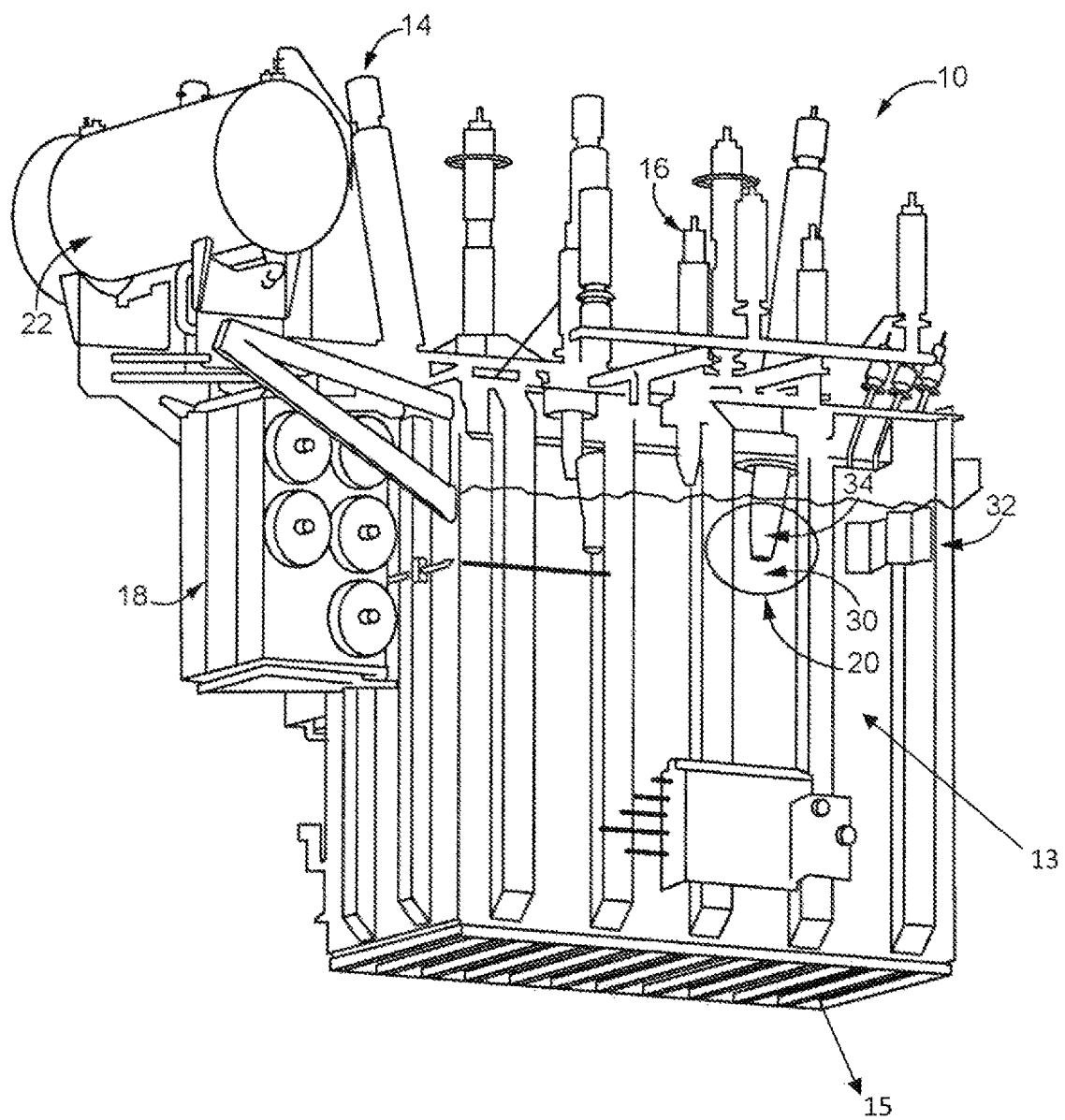
FIG. 2 is a side sectional view of the power transformer of FIG. 1.

Referring now to FIG. 2, the exemplary port 20 is located in the side wall of the tank 12 can provide physical and sensor access to the transformer 10. A removable cover 30 can be coupled to a port 20 to provide sensor access to one or more internal components 34 of the transformer 10. By way of example and not limitation the internal components 34 may include coil windings, cables, tap changers, support structures, tap board connections, high voltage and low voltage lead connections to corresponding coil windings, jumper cable connections and crimped or braised electrical connections.

The transformer 10, when outfitted with an 'on-load' or 'load' tap changer (not shown) installed in or to the tank 10, may have a port 20 and corresponding cover 30 located proximate to the tap changer to facilitate sensor access. The on-load tap changer can include a tank that contains an insulating medium 32. In one form of the present application any of the acoustic, optical, and thermal sensors 51, 52, 53 (see FIG. 6) described herein can be used to monitor the operation of the tap changer. A person having ordinary skill in the art will recognize that the on-load tap changer switches the connection between taps to control the output voltage while the primary winding is connected to a voltage source and the secondary winding is connected to a load.

Figure 3:
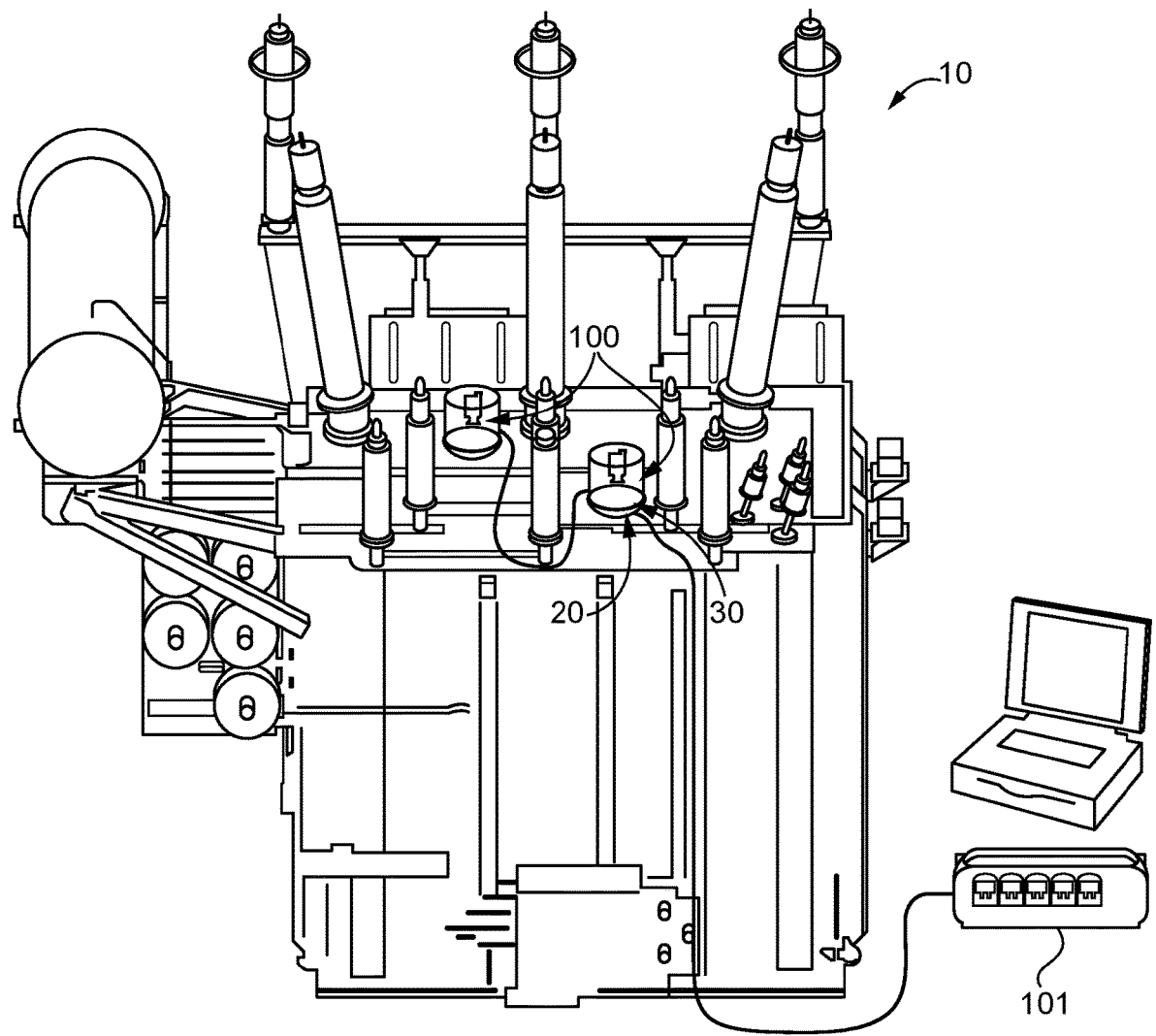
FIG. 3 is a perspective view of the transformer of FIG. 1 with sensor containers and a control processing unit.

With reference now to FIG. 3, the transformer 10 can include a container 100 configured to attach to a cover 30 or port 20. In one form, the container 100 can include a tubular body and opposing end walls. In some embodiments, one of the opposing end walls can be the cover 30. The container 100 may be formed in any shape as long as the end wall 30 that contacts the port 20 is capable of being separable from the port 20. The removable cover 30 and container 100 can be at least partially formed of a material that is transparent, translucent or otherwise sufficient to facilitate measurement or sensing access for a variety of sensor types such as optical sensors 52 and thermal imaging sensors 53 that measure properties of the internal components through the port 20 and/or cover 30. Hot spots, partial discharge and other problems impacting the internal components of the transformer can be readily detectable when the transformer 10 is operating, whereas such problems may not be detectible after the transformer is de-energized. A control system 101 can be operably connected to one or more sensors so as to provide real time collection and analysis of the data collected by the sensors. The control system 101 may provide a warning signal or shut down operation of a portion of the electrical apparatus when a measured or sensed parameter exceeds a predetermined maximum threshold value or falls below a predetermined minimum threshold value.

Figure 4:
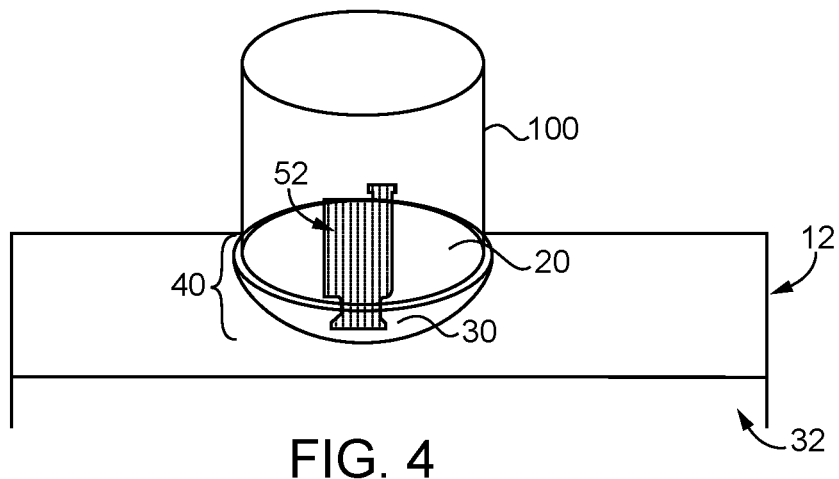
FIG. 4 is a perspective view of a sensor container connected to a concave cover.

As shown in FIG. 4, the removable cover 30 or an end wall of a container 100 proximate to the port 20 can have a concave shape with respect to an installed sensor. A concave cover 30 facilitates a wider viewing angle so that additional portions of the internal volume may be viewed or otherwise sensed by a sensor. The cover 30, when formed in a concave shape, provides a viewing envelope 40 for the sensor(s) installed proximate to the cover 30. A portion of the concave cover 30 can extend into the gas space and insulating medium 32, however, the sensor located within the viewing envelope 40 remains separated from the insulating medium 32 in some embodiments. In one embodiment, the concave cover 30 is a fisheye lens that provides up to a 180-degree viewing angle. The internal volume of the transformer 10 can be partially defined by an inside wall of the cover 30. In the case of a tank provided with a concave cover 30, the opposing convex surface of the cover 30 and the internal walls of the tank 12 that face the insulating medium 32 form the boundaries of the internal tank volume.

When the optical and thermal sensors 52, 53 are positioned proximate to the concave side of the cover 30, the sensors 52, 53 are not in contact with the insulating medium 32 within the internal volume of the transformer. The cover 30, when embodied in a concave shape, extends into the insulating medium 32 and provides a wider viewing angle for an optical or thermal sensor having a lens that is located inside the hemisphere created in the depth of the concave side of the cover 30.

Any sensor, including the optical and thermal sensors, 52, 53 may be mounted with a pan-and-tilt mechanism (not shown) to the concave side of the cover 30. The pan-and-tilt type of mounting arrangement enhances the viewing angle of each sensor. Additionally, the optical sensor 52 may be provided with a fisheye lens for enhancing the viewing capability of the sensor.

Figure 5:
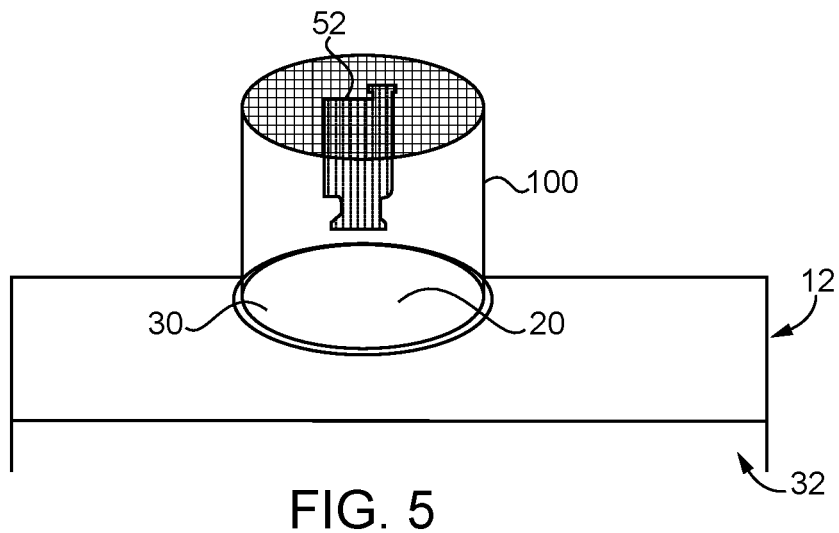
FIG. 5 is a perspective view of a container connected to a flat cover.
Figure 6:
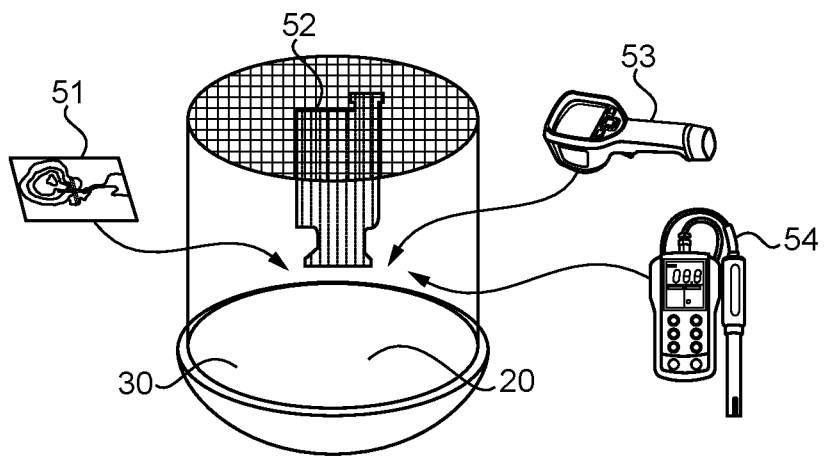
FIG. 6 depicts exemplary sensors that may be associated with the power transformer of FIG. 1.

With reference to FIGS. 5 and 6, sensors housed by the container 100 can include an optical visual sensor 52 such as a camera, a thermal sensor 53 such as an infrared sensor, and acoustic sensor 51 and/or a total dissolved solid sensor 54 as well as other sensors such as pressure and temperature sensors. As previously described, the internal volume of the transformer of FIG. 5 is defined by the inside surface of the cover 30 facing the insulating medium 32 and the internal walls of the tank 12. The acoustic, optical 52, and thermal 53 sensors are not in contact with the internal volume or insulating medium 32 of the transformer 12.

While certain sensors are not configured to physically contact the internal volume of the tank, other sensors may be positioned on an internal side of the removable cover 30 such that physical contact may occur with portions of the internal volume. Certain sensors such as fiber optical glass meters and total dissolved solid meters can be coupled to an inner wall of the cover 30 and extend into the insulating medium 32. The fiber-optical glass gas meter can be used to measure hydrogen gas (H2) and other gas content such as oxygen (O2), nitrogen (N2), carbon monoxide (CO), carbon dioxide (CO2), methane (CH4), ethane (C2H6), ethylene (C2H4), acetylene (C2H2), propane (C3H8) and propylene (C3H6).

The total dissolved solid meter 54 may be mounted on the inside of the cover 30 and have a corresponding probe for extending into the transformer insulating 10 medium. The total dissolved solid meter 54 measures conductivity of a medium having dissolved or suspended solid particles therein. It should be understood that the sensors having contact with the internal volume may be installed while the transformer is de-energized and empty or drained of at least a portion of the insulating fluid.

One or more acoustic sensors 51 can be coupled with a container 100 and/or a removable cover 30. The acoustic sensors 51 can be used to detect vibrations in the components of the internal volume of the transformer 10. Acoustic sensors 51 can be used to detect vibration in components of the transformer 10 such as cables or windings. The sensors 51 can be single or multi-head acoustic sensing devices. The sensed vibrations may indicate slack in the coil windings or cabling attached to the leads extending from the coil windings. The slack in coil windings or cabling can be detected by vibration waveform output received by the sensor 51. In the event that the threshold for any values of the acoustic waveform exceed a predetermined threshold for the characteristic value for the acoustic waveform during operation of the transformer, the transformer is determined to be operating outside of the in-operation range and a maintenance action is indicated.

A thermal sensor 53, such as an infrared sensor, detects heat emitted as radiation from the windings, cabling, and supports or other heat generating components. The thermal images captured over time by the infrared sensor can be used to determine hot spot locations and predict aging damage over time to the windings, cabling or other components. The thermal images can be used to detect slack in the cabling or winding comparing images generated over a period of time. Thermal monitoring of internal transformer components during operation of the transformer provides information on potential hot spots that would not otherwise be detectable when the transformer 10 is de-energized. It should be noted that thermal sensors 53 do not require a clear insulating medium 32 in order to detect hot spots experienced during operation of the transformer 10 in contrast to some other types of optical sensors.

Figure 7A:
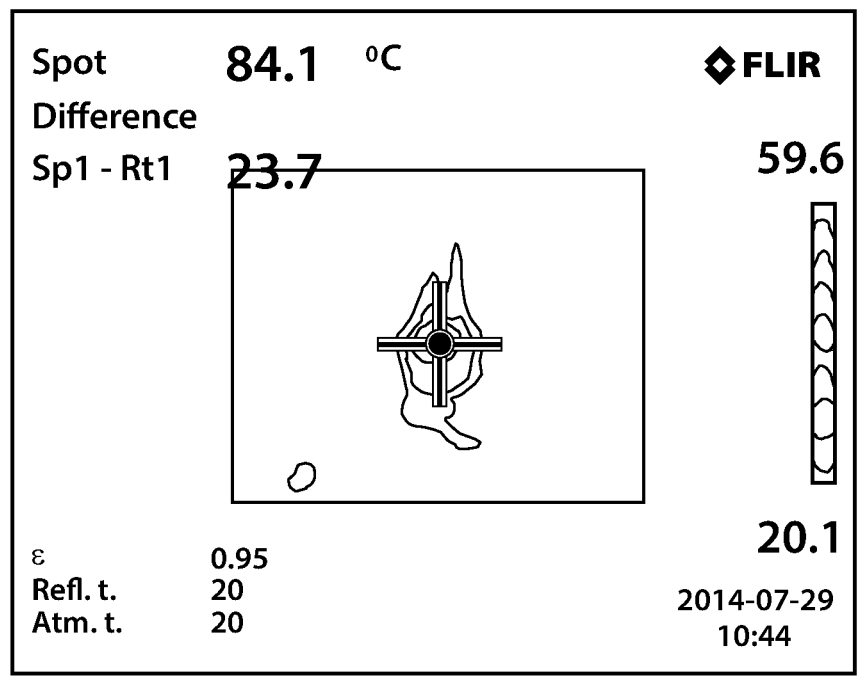
FIG. 7a is an exemplary thermal image of a heat source in the air as measured by a thermal sensor.
Figure 7B:
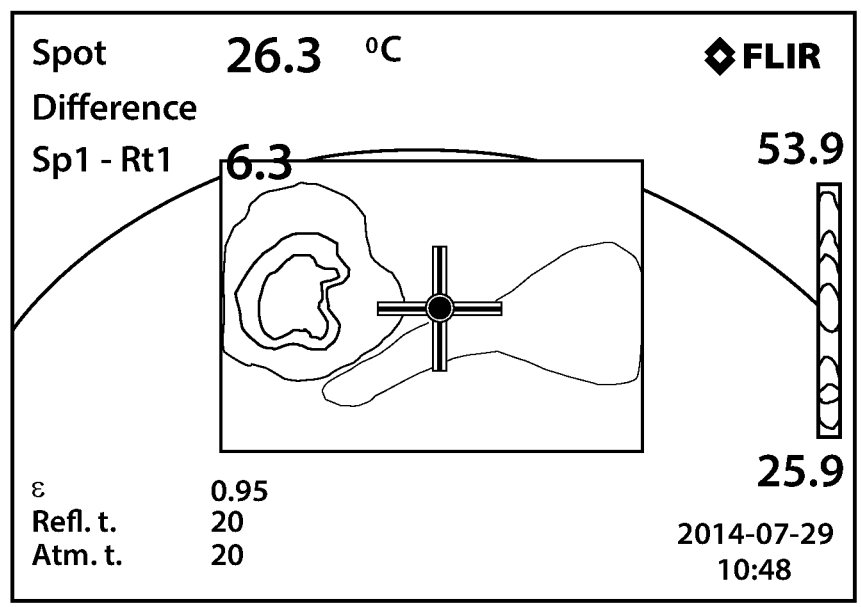
FIG. 7b is an exemplary thermal image of a heat source in a transformer insulating medium with a standard temperature range scale.
Figure 7C:
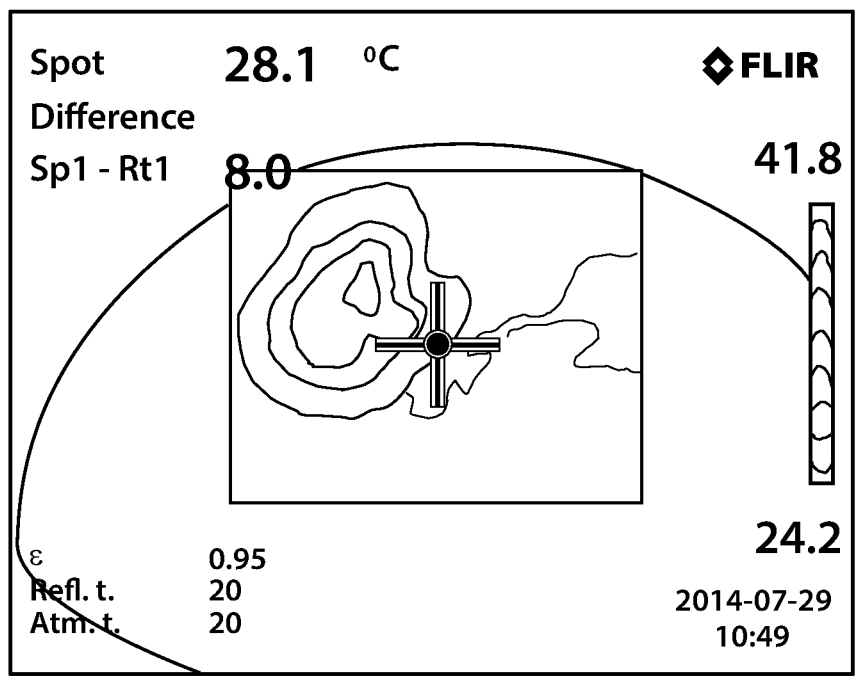
FIG. 7c is an exemplary thermal image of a heat source in a transformer insulating medium with an adjusted temperature range scale.

Exemplary thermal images generated by the thermal sensor 53 are depicted in FIGS. 7a-7c. With particular reference to FIG. 7a, a thermal image of a heat source in air is shown. In comparison, an image of a heat source in transformer insulating oil at about one foot in depth is shown in FIG. 7b. The heat source of FIG. 7a indicated a measured temperature at 84 degrees Celsius whereas the same heat source was measured in transformer insulating oil and the hottest point was approximately about 30 degrees Celsius as depicted in FIG. 7b. Further, in FIG. 7c, a thermal image of the heat source in the transformer insulating fluid at about one foot in depth is shown. FIG. 7b is illustrated with a standard temperature range scale whereas FIG. 7c is illustrated with an adjusted temperature range scale. The adjusted temperature range scale of the thermal camera allows the location and shape of the heat resource to be measured with increased accuracy.

Characteristics such as intensity and location of the heat source in a set of thermal images can be analyzed with data obtained from other sensors to track the damage to the components, loosening of a connection and other potential failure points of components in the internal volume. In addition to providing information on actual damage impacting a transformer during operation, the images and data are also used to predict a fault condition before it occurs. In the event that a characteristic value for the thermal data or any other sensor data exceeds a predetermined threshold for that characteristic value, the transformer can be taken offline.

In addition to the detection of hot spots, loose cables and components of the transformer operating near or above the threshold temperature limits, thermal sensors 53 are also used to detect erosion in the insulation on the conductors used in the windings of the coil assemblies, cabling or leads. Sensors such as thermal imaging cameras measure temperature, therefore, if the temperature threshold is exceeded for any component in the internal volume, there is a pending failure in the system. As partial discharge occurs not long before a failure in a transformer component, it is critical to detect at the first indication of insulation erosion and maintain the transformer 10 immediately upon detection.

The cover 30 and/or container 100 is installed to the respective port(s) after the transformer has been de-energized and drained partially or completely of insulating fluid. The draining of the transformer 10 whether partial or complete is dependent upon the location of the port to which the sensors are installed. Installation of sensors to a port on a bottom surface of the transformer 10 require a complete draining of insulating medium 32 whereas installation of sensors to a port on the top or side surfaces of the transformer permit a partial drain of transformer dielectric fluid. Alternatively, the cover 30 and/or container 100 can be provided with a newly manufactured transformer 10 before the transformer is placed in operation. Further, the cover 30 and/or container 100 with associated sensors 51, 52, 53, 54 can be moved and re-installed on different transformers having compatible ports 20.

The signals and images from the sensors 51, 52, 53, 54 can be transmitted by a communication medium to the control system 101 including a data acquisition unit as shown in FIG. 3. An associated signal conditioning and processing device or a supervisory control and data acquisition (SCADA) system can be operably coupled with the control system 101. The data processed by the data acquisition unit may be further transmitted to an asset management system through the SCADA system. The control system 101 including a computational data processing unit may include a non-transitory computer readable medium upon which are stored program instructions, that when executed by a processor, cause the processor to perform the following operations: process the transmitted signals from at least one sensor and compare the conditioned data to a predetermined threshold for the characteristic of the transformer internal component being monitored. If the predetermined threshold is exceeded for the characteristic value being measured, then the data acquisition unit provides a warning or alarm indication and a location inside the internal volume of the component to be reviewed. The warning or alarm is actionable and the transformer is able to be taken immediately offline.

In one aspect the present disclosure includes a transformer, comprising: a tank having one or more walls to define an internal volume; at least one electrical coil, a core and an insulating medium disposed within the internal volume of the tank; a port coupled with one or more of the walls to provide access to the internal volume; and at least one sensor coupled to the tank proximate the port, the sensor operable to obtain a characteristic value of at least one of the components within the internal volume while the at least one electrical coil is energized.

In refining aspects, the present disclosure further comprises a cover formed from a material configured to permit the at least one sensor to receive a sensed parameter therethrough; wherein the cover is at least partially transparent; wherein the at least one sensor is mounted to an external portion of the cover and operates without physical contact with the internal volume of the tank; wherein the at least one sensor is one of an optical sensor, a thermal sensor, a gas meter, a conductivity meter, a fiber optic gas meter and/or a total dissolved solid sensor; wherein the sensor is mounted to an interior portion of the cover and operates in physical contact with the internal volume of the tank; wherein the cover is concave in shape with respect to the at least one sensor; a control system in electrical communication with the at least one sensor; wherein the control system is configured to analyze a sensed value of a measurement parameter obtained by the at least one sensor; wherein the measurement parameter includes one or more of a temperature, a pressure, a vibration, material composition, and an optical image; wherein control system is configured to transmit a warning signal and/or shut off electrical power to the transformer when the sensed value exceeds a maximum predetermined threshold value or falls below a minimum predetermined threshold value.

In another aspect, an electrical system comprises a housing configured to hold electrical components within an internal volume; a sensor mounted to the housing configured to sense a parameter associated with one or more electrical components during operation; and a control system including a communication unit and a data processing unit operable for analyzing the sensed parameter and comparing the sensed parameter to a predetermined minimum or maximum threshold value.

In refining aspects the disclosure further comprises at least one access port connected to the housing; and a container removeably attached to the access port; wherein the container further comprises at least one end wall positioned adjacent to the access port, the end wall configured to provide sensor access to the internal volume; wherein the sensor, communication unit and the data processing unit are positioned within the container; wherein the control system is operable to send a warning signal and/or shut down electrical power to the electrical system when sensed parameter exceed a predetermined maximum value or falls below a predetermined minimum value; wherein the sensor provides a thermal image of electrical components in an insulating medium; wherein the at least one end wall is concave in shape relative to a location of the sensor; wherein the sensor extends into the internal volume of the housing wherein the sensor includes at least one of a thermal, acoustic and/or an optical measurement.

In another aspect the present disclosure includes a method comprising operating an electrical apparatus within an internal volume of a tank; sensing a physical parameter associated with a component located within the internal volume; comparing a value of the physical parameter with a predetermined threshold value during the operation of the electrical apparatus; and determining when the value of the physical parameter exceeds a predetermined maximum threshold value or falls below a predetermined minimum threshold value.

In refining aspects, the sensing includes a sensor positioned proximate a port external to the housing; the sensing includes transmitting one or more of an optical, a thermal and an acoustic signal to a processor; and transmitting a warning signal and/or de-energizing the electrical apparatus after a determination that the physical parameter exceeds the predetermined maximum threshold value or falls below the predetermined minimum threshold value.

Another aspect includes a transformer, comprising a tank having components including at least one energized coil, a core and insulating medium disposed within an internal volume of the tank and a port; and at least one sensor proximate to the port and not in physical contact with the insulating medium of the tank, the sensor operable to obtain a characteristic value of at least one of the components within the internal volume while the at least one coil is energized. wherein the tank has a top, bottom and side walls, and the port has a transparent cover and the at least one sensor is mounted to the exterior of the cover; wherein the sensor is selected from the group consisting of an optical sensor and a thermal sensor; wherein the sensor is mounted to the interior of the cover to the port; wherein the sensor is selected from the group consisting of a gas meter and a conductivity meter; wherein the sensor is selected from the group consisting of a fiber optic gas meter and a total dissolved solid sensor; wherein the cover is concave in shape with respect to a lens of the optical sensor; and further comprising a data processing unit for receiving measured values from the at least one sensor.

Another aspect includes a transformer system, comprising a transformer having a tank with a port and at least one coil assembly, a core and an insulating medium is disposed in an internal volume therein; and a sensor mounted external to the tank for monitoring components in the internal volume of the tank through the port and without the sensor extending into the internal volume of the tank; wherein at least one access port to the internal volume is provided in a wall of the tank and a container having a tubular body and opposing end walls is attached to the access port, at least one of the end walls in communication with the access port and providing a window for viewing the internal volume, the container in removable connection to the access port and having a sensor housed therein for inspecting the tank internal volume through the access port; wherein the sensor, a communication unit, and a data processing unit are housed inside a container removeably attached to a port formed in the tank; wherein the data processing unit compares the characteristic values generated by the at least one sensor to predetermined thresholds for the characteristic value during transformer operation; wherein the sensor provides a thermal image of electrical components in the insulating medium; wherein the sensor is attached to the end wall of the container proximate to the port; wherein at least one end wall is concave in shape in relation to a viewing angle of the sensor; wherein the sensor extends into the insulating medium; and further comprising a computer readable medium and instructions stored thereupon that when executed compare the measurements to predetermined thresholds for at least one of thermal, acoustic and optical measurements.

Another aspect includes a method, comprising operating a transformer to provide a converted electrical output, the transformer having a tank with an internal volume including a coil, a core and an insulating fluid; reviewing a physical component within the internal volume for a characteristic value during the operation of the transformer with a sensor located outside of physical contact with the internal volume; and comparing the characteristic value from the reviewing with a predetermined characteristic value; wherein the sensor is attached to a port in the transformer tank, the port providing visibility to the physical component within the internal volume; wherein the reviewing is performed by a sensor selected from the group consisting of an optical sensor, a thermal sensor and an acoustic sensor; and further comprising de-energizing the transformer when the result of the reviewing exceeds the predetermined characteristic value.

While the invention has been illustrated and described in detail in the drawings and foregoing description, the same is to be considered as illustrative and not restrictive in character, it being understood that only the preferred embodiments have been shown and described and that all changes and modifications that come within the spirit of the inventions are desired to be protected. It should be understood that while the use of words such as preferable, preferably, preferred or more preferred utilized in the description above indicate that the feature so described may be more desirable, it nonetheless may not be necessary and embodiments lacking the same may be contemplated as within the scope of the invention, the scope being defined by the claims that follow. In reading the claims, it is intended that when words such as "a," "an," "at least one," or "at least one portion" are used there is no intention to limit the claim to only one item unless specifically stated to the contrary in the claim. When the language "at least a portion" and/or "a portion" is used the item can include a portion and/or the entire item unless specifically stated to the contrary.

Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

What is claimed is:

1. A transformer, comprising:
a tank having one or more walls to define an internal volume: at least one electrical coil, a core and an insulating medium disposed within the internal volume of the tank;
a port coupled with one or more of the walls to provide access to the internal volume; and
at least one sensor coupled to the tank proximate the port, the sensor operable to obtain a characteristic value of at least one of the components within the internal volume while the at least one electrical coil is energized;
a cover formed from a material configured to permit the at least one sensor to receive a sensed parameter therethrough,
wherein the cover is at least partially transparent.

2. The transformer of claim 1, wherein the at least one sensor is mounted to an external portion of the cover and operates without physical contact with the internal volume of the tank.

3. The transformer of claim 1, wherein the cover is concave in shape with respect to the at least one sensor.

4. The transformer of claim 1, wherein the control system is configured to analyze a sensed value of a measurement parameter obtained by the at least one sensor.

5. The transformer of claim 4, wherein control system is configured to transmit a warning signal and/or shut off electrical power to the transformer when the sensed value exceeds a maximum predetermined threshold value or falls below a minimum predetermined threshold value.

6. An electrical system comprising:
a housing configured to hold electrical components within an internal volume;
a sensor mounted to the housing configured to sense a parameter associated with one or more electrical components during operation; and
a control system including a communication unit and a data processing unit operable for analyzing the sensed parameter and comparing the sensed parameter to a predetermined minimum or maximum threshold value;
at least one access port connected to the housing; and
a container removably attached to the access port.

7. The system of claim 6, wherein the sensor, communication unit and the data processing unit are positioned within the container.

8. The system of claim 6, wherein the control system is operable to send a warning signal and/or shut down electrical power to the electrical system when sensed parameter exceed a predetermined maximum value or falls below a predetermined minimum value.

9. The system of claim 6, wherein the sensor extends into the internal volume of the housing.

10. A method, comprising:
operating an electrical apparatus within an internal volume of a tank;
sensing, using a sensor, a physical parameter associated with a component located within the internal volume, wherein the sensing is performed via a cover that is at least partially transparent and formed from a material configured to permit the sensor to receive a sensed parameter therethrough;
comparing a value of the physical parameter with a predetermined threshold value during the operation of the electrical apparatus; and
determining when the value of the physical parameter exceeds a predetermined maximum threshold value or falls below a predetermined minimum threshold value.

11. The method, of claim 10 further comprising transmitting a warning signal and/or de-energizing the electrical apparatus after a determination that the physical parameter exceeds the predetermined maximum threshold value or falls below the predetermined minimum threshold value.

12. A transformer, comprising:
a tank having components including at least one energized coil, a core and insulating medium disposed within an internal volume of the tank and a port; and
at least one sensor proximate to the port and not in physical contact with the insulating medium of the tank the sensor operable to obtain a characteristic value of at least one of the components within the internal volume while the at least one coil is energized,
wherein the port has a transparent cover.

13. The transformer of claim 12, wherein the tank has a top, bottom and side walls, and the at least one sensor is mounted to the exterior of the cover.

14. A transformer system, comprising:
a transformer having a tank with a port and at least one coil assembly, a core and an insulating medium is disposed in an internal volume therein; and
a sensor mounted external to the tank for monitoring components in the internal volume of the tank through the port and without the sensor extending into the internal volume of the tank,
wherein at least one access port to the internal volume is provided in a wall of the tank and a container having a tubular body and opposing end walls is attached to the access port, at least one of the end walls in communication with the access port and providing a window for viewing the internal volume, the container in removable connection to the access port and having a sensor housed therein for inspecting the tank internal volume through the access port.

15. The system of claim 14, wherein the data processing unit compares the characteristic values generated by the at least one sensor to predetermined thresholds for the characteristic value during transformer operation.

16. The system of claim 14, wherein the data processing unit determines when the value of the physical parameter exceeds a predetermined maximum threshold value or falls below a predetermined minimum threshold value.

17. A method, comprising:
operating a transformer to provide a converted electrical output, the transformer having a tank with an internal volume including a coil, a core and an insulating fluid;
reviewing, using a sensor, a physical component within the internal volume for a characteristic value during the operation of the transformer with a sensor located outside of physical contact with the internal volume, wherein the reviewing is performed via a cover that is at least partially transparent; and
comparing the characteristic value from the reviewing with a predetermined characteristic value.

* * * * *